United States Patent
Luedecke et al.

(10) Patent No.: US 6,796,664 B2
(45) Date of Patent: Sep. 28, 2004

(54) METHOD AND DEVICE FOR DECONTAMINATING OPTICAL SURFACES

(75) Inventors: Jens Luedecke, Aalen (DE); Christoph Zazcek, Heubach (DE); Alexandra Pazidis, Aalen (DE); Jens Ullmann, Oberkochen (DE); Annette Muehlpfordt, Aalen (DE); Michael Thier, Moegglingen (DE); Stefan Wiesner, Lauchheim (DE)

(73) Assignee: Carl Zeiss SMT AG, Oberkochen (DE)

( * ) Notice: Subject to any disclaimer, the term of this patent is extended or adjusted under 35 U.S.C. 154(b) by 0 days.

(21) Appl. No.: 10/385,643

(22) Filed: Mar. 12, 2003

(65) Prior Publication Data

US 2003/0210458 A1 Nov. 13, 2003

(30) Foreign Application Priority Data

Mar. 12, 2002 (DE) .......................... 102 11 611

(51) Int. Cl.[7] .............................................. G02B 11/04
(52) U.S. Cl. ...................... 359/507; 359/509; 359/513
(58) Field of Search ................................ 359/507–509, 359/513; 355/53, 67–71, 30; 250/492.2

(56) References Cited

U.S. PATENT DOCUMENTS

| | | | | |
|---|---|---|---|---|
| 4,704,348 A | * | 11/1987 | Koizumi et al. ............. | 430/327 |
| 5,460,888 A | * | 10/1995 | Hashimoto et al. .......... | 428/432 |
| 5,532,871 A | * | 7/1996 | Hashimoto et al. .......... | 359/359 |
| 5,545,516 A | * | 8/1996 | Wagner ......................... | 435/2 |
| 5,602,683 A | | 2/1997 | Straaijer et al. | |
| 6,252,648 B1 | | 6/2001 | Hase et al. | |
| 6,288,769 B1 | * | 9/2001 | Akagawa et al. ............. | 355/30 |
| 6,571,057 B2 | * | 5/2003 | Aoki ............................. | 396/53 |
| 6,671,033 B2 | * | 12/2003 | Akagawa et al. ............. | 355/30 |

FOREIGN PATENT DOCUMENTS

| | | |
|---|---|---|
| DE | 198 30 438 A1 | 1/2000 |
| JP | 07-288109 | 10/1995 |
| JP | 2000066003 A | 3/2000 |
| JP | 2001015472 A | 1/2001 |
| JP | 2001293442 A | 10/2001 |

* cited by examiner

Primary Examiner—Mohammad Sikder
(74) Attorney, Agent, or Firm—Sughrue Mion, PLLC

(57) ABSTRACT

A method and a device for decontaminating optical surfaces, in particular for decontaminating the surfaces of beam-guiding optics employing UV-radiation in a cleansing atmosphere. The wavelength of the UV-radiation employed falls within a range where oxygen strongly absorbs and the cleansing atmosphere has an oxygen concentration less than that of air. The method and device have application to, e.g., cleaning the surfaces of the beam-guiding optics of microlithographic projection-exposure systems.

6 Claims, 2 Drawing Sheets

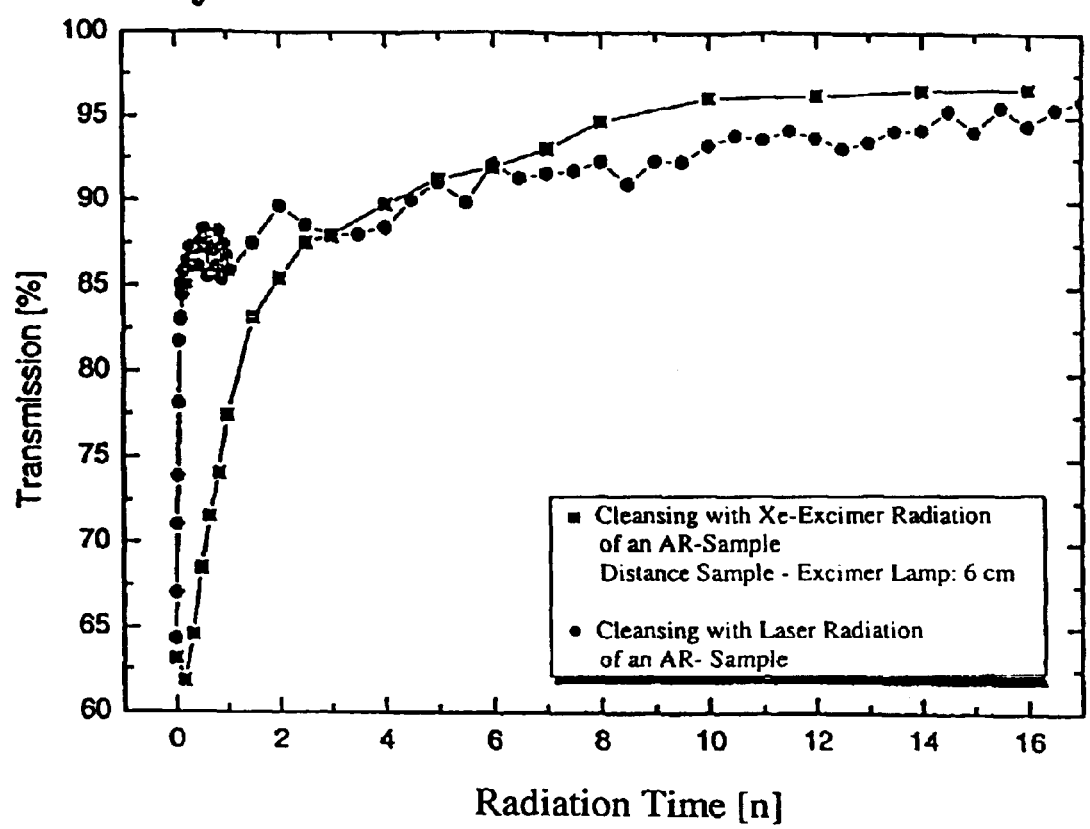

METHOD AND DEVICE FOR DECONTAMINATING OPTICAL SURFACES

The following disclosure is based on German Patent Application No. 10211611.3, filed on Mar. 12, 2002, which is incorporated into this application by reference.

FIELD OF AND BACKGROUND OF THE INVENTION

The invention relates to a method and a device for decontaminating the surfaces of beam-guiding optics employing UV-radiation in a cleansing atmosphere. Methods and devices of this type are used for, for example, decontaminating the surfaces of the lenses and other optical elements of beam-guiding optics, such as those employed on microlithographic projection-exposure systems.

In the case of modern microlithographic projection-exposure systems that employ very-short-wavelength radiation from the deep-ultraviolet (DUV) spectral region having wavelengths ranging from about 100 nm to about 300 nm for their operation, especially those that employ, e.g., 157-nm laser radiation for their operation, contaminants present on the surfaces of their beam-guiding optics that are struck by illuminating radiation cause readily noticeable, serious, problems due to absorption and/or scattering. The decontamination process is intended to remove such contaminants, or at least reduce their presence to acceptable levels.

A decontamination method for that purpose and an associated decontamination device incorporated into a microlithographic projection-exposure system are described in German patent application DE 198 30 438 A1. In the case of the technology employed therein, in addition to a DUV excimer laser serving as an exposure source, a second UV light source, e.g., a broadband DUV excimer laser or a 222-nm UV excimer lamp, serving as a decontaminating light source is also provided. The decontaminating light source incorporated into the projection-exposure system is activated during pauses in the employment of the exposure light source. In parallel therewith, a stream of cleansing gas is directed at the surfaces to be cleaned, where employment of a stream of gas containing ozone or oxygen was proposed. The latter is to be interpreted as a stream of gas having an oxygen content exceeding that of air, since that particular approach is based on the presumption that obtaining an adequate cleansing effect requires a correspondingly high oxygen concentration in the stream of cleansing gas.

This cleansing effect employing a combination of UV-radiation and an oxygen-rich or ozone-rich gas is also known in the case of decontamination of the surfaces of substrates, such as the surfaces of glass substrates and wafers. Refer to, for example, Japanese patent application JP 07-288109 A, where the combination of Xe-excimer-laser radiation at a wavelength of, e.g., 172 nm, with a cleansing atmosphere containing ozone or an air atmosphere was proposed. The purpose of the oxygen is oxidizing organic contaminants and forming hydrophilic groups in the concentrations regarded as necessary. The fact that the range of the UV-radiation at wavelengths of about 172 nm employed for cleansing purposes is relatively short due to high absorption by oxygen is counter-acted by moving the surfaces to be cleaned sufficiently close, e.g., to within less than 3 mm, to the UV light source employed for cleaning or employing longer-wavelength UV-radiation, e.g., UV-radiation having wavelengths of 185 nm or 254 nm, for cleansing purposes. Although cleaning the surfaces of beam-guiding optics that have been designed for guiding relatively short-wavelength laser radiation having wavelengths of, e.g., 157 nm, using laser radiation having the same wavelength is feasible, in practice, it is a very difficult procedure and confined to relatively small areas covering just a few square millimeters of the surfaces to be cleaned.

OBJECTS OF THE INVENTION

One technical problem addressed by the invention is providing a method and a device of the type mentioned at the outset hereof with which the surfaces of beam-guiding optics, in particular, optics for guiding the beams of DUV-lasers emitting at wavelengths of about 157 nm and less, with relatively little effort and reliably decontaminating surfaces bearing disturbing contaminants, even contaminants that are distributed over large areas thereof.

SUMMARY OF THE INVENTION

The invention solves that problem in one aspect by providing a method for decontaminating surfaces of beam-guiding optics, in particular, the surfaces of optical elements of microlithographic projection-exposure systems, where the surfaces to be cleaned are irradiated with UV-radiation in a cleansing atmosphere, wherein the wavelength of the UV-radiation employed for cleaning falls within a spectral range where oxygen absorbs strongly and the cleansing atmosphere has an oxygen concentration less than that of air. In a further aspect the invention provides a device for decontaminating surfaces of beam-guiding optics, in particular, the surfaces of optical elements of microlithographic projection-exposure systems, having one or more UV-radiation sources for generating UV-radiation for cleaning purposes and means for providing a predeterminable cleansing atmosphere, wherein the wavelength of the UV-radiation employed for cleaning falls within a spectral range where oxygen absorbs strongly and the means for providing the cleansing atmosphere is designed to provide a cleansing atmosphere that has an oxygen concentration less than that of air.

According to the invention, UV-radiation having a wavelength falling within a spectral range characterized by strong absorption by oxygen is provided for decontamination purposes and the problem of the decontaminating radiation having a short range due to the high absorption by oxygen is counteracted by utilizing a cleansing atmosphere that has a comparatively low oxygen concentration that is less than that of air. Investigations have shown that combining such decontaminating radiation with a cleansing atmosphere having a low oxygen content, or no oxygen content, will allow attaining adequate cleaning actions, even in the case of beam-guiding optics that have been designed for guiding short-wavelength UV laser light having a wavelength of, e.g., 157 nm, such as those employed on microlithographic projection-exposure systems that employ DUV-radiation for their operation.

In a preferred embodiment of the invention, the oxygen concentration in the cleansing atmosphere is held to less than 1%, preferably less than 0.1%.

In a beneficial embodiment of the invention, the decontaminating radiation is generated by Xe-discharge lamp having a wavelength of 172 nm; or a low-pressure mercury lamp. In either case, the effort required to achieve adequate cleansing actions is much less than when short-wavelength laser radiation having a wavelength of about 157 nm is employed.

An advantageous embodiment of a decontamination device comprises a cleaning chamber having a cleaning section, into which, e.g., optical elements, may be placed for the purpose of cleaning their surfaces. Several UV-radiators that are spaced at intervals and act on the cleaning section are employed for cleaning, where a stream of cleansing gas having a low oxygen content, or no oxygen content, may be conducted over the full extent of the cleaning section.

In a further beneficial improvement on the invention, the decontamination device is incorporated into an optical module in order that the surfaces of its optical elements may also be cleaned from time to time after the module has been placed in service. The optical module may be part of a microlithographic projection-exposure system in order that the surfaces of its optical elements may be cleaned whenever necessary.

BRIEF DESCRIPTION OF THE DRAWINGS

Beneficial embodiments of the invention are illustrated in the drawings and will be described below. The figures depict.

DETAILED DESCRIPTION OF THE PREFERRED EMBODIMENTS

Figure 1:
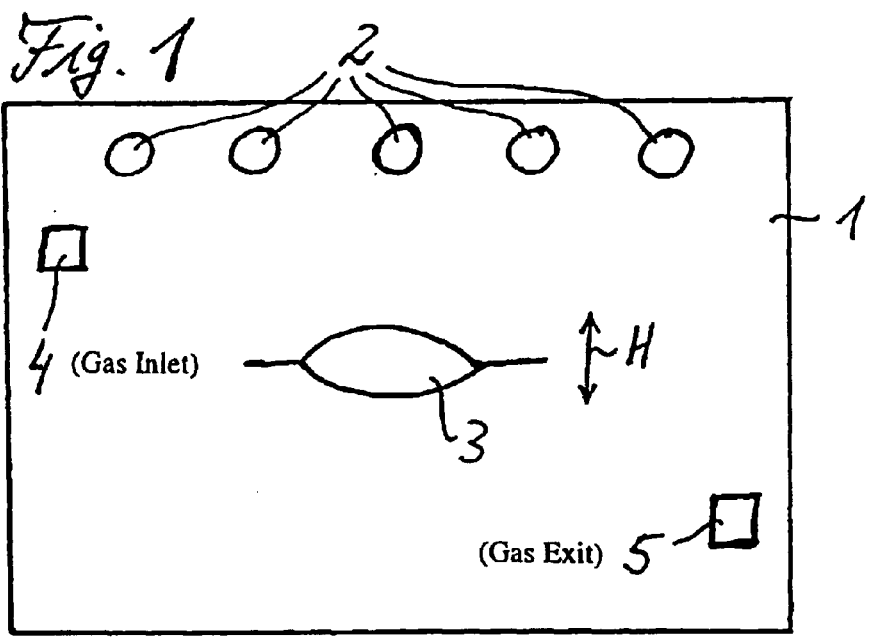
FIG. 1 a schematized side view of a cleaning chamber for decontaminating the surfaces of optical elements to be placed therein, FIG. 2 a plot of the total transmittances of optical elements cleaned in the device shown in FIG. 1 as a function of wavelength for various oxygen partial pressures in the cleaning atmosphere, and FIG. 3 a plot comparing the transmittance of an optical element decontaminated in the device shown in FIG. 1 as a function of decontamination period to that for an optical element decontaminated using 157-nm laser radiation.

FIG. 1 depicts that portion of a device for decontaminating the surfaces of optical elements that is essential to the invention. As illustrated by the schematized drawing appearing in FIG. 1, the decontamination device contains a hermetically sealed cleaning chamber 1, within which several UV-radiators 2 are arranged spaced at intervals with respect to one another on a top side of the chamber 1 such that they radiate UV-radiation toward a central section of the chamber serving as a cleaning section. Optical elements may be placed in the cleaning section for decontamination or cleaning of their surfaces. As an example thereof, FIG. 1 depicts a lens 3, complete with its associated mount. A stream of cleansing gas may be conducted over the full extent of the cleaning section of the chamber 1, for which the chamber is provided with a gas inlet 4 situated within a first section on one side of the chamber and a gas exit 5 situated within a second section on the opposite side of the chamber. The associated gas-supply system and gas-exhaust system are of conventional types, and are thus not explicitly shown in FIG. 1.

Xenon discharge lamps that emit excimer radiation in the form of a continuum having a spectral bandwidth of about 13 nm centered on a wavelength of 172 nm serve as UV-radiators 2. Thanks to the spaced arrangement of the several UV-radiators 2, the decontaminating radiation illuminates the cleaning section at various angles and with a highly uniform intensity distribution in order that large areas of surfaces of the respective optical elements 3 to be cleaned facing the UV-radiators 2 may be uniformly illuminated by the decontaminating radiation, which will allow reliably cleaning both essentially planar and sharply curved surfaces. Suitable reflectors may be mounted on the back side in order to increase irradiation levels. It should be obvious that, depending upon the particular application involved, the UV-radiators 2 may, alternatively, be distributed in a different manner over suitable locations on the cleaning chamber 1, instead of being distributed over one side of the chamber 1, as shown.

A carrier (not shown), on which the optical elements 3 to be cleaned are mounted and that is installed within the chamber 1 such that its height may be adjusted, as symbolically indicated in FIG. 1 by the double-headed arrow, H, is preferably provided in the cleaning section. Other motions of this carrier, e.g., such that will allow rotating the optical elements 3 to be cleaned within the cleaning section of the chamber 1, may also be provided, if needed.

The emission wavelength chosen for the UV-radiators 2, 172 nm, has proven to be particularly efficient for producing ozone, since it lies close to the absorption maximum of molecular oxygen ($O_2$). The Xe-discharge lamps employed for this purpose have high UV-radiation efficiencies, which keeps thermal loading of the optical elements 3 to be cleaned low. Various models of suitable Xe-excimer radiators are commercially available from, e.g., the company Radium, Wipperfürth, Germany. Low-pressure mercury lamps having emission lines in the vicinities of 185 nm and 254 nm whose spectral intensities in the very deep ultraviolet (VUV) spectral region are, however, lower than those of Xe-discharge lamps, may also be employed.

The absorption coefficient of molecular oxygen for the UV-radiation at a wavelength of about 172 nm emitted by Xe-discharge lamps 2 is roughly 5 $cm^{-1}$, which corresponds to a range of 1.4 mm for an intensity reduction of half the incident intensity in pure molecular oxygen and about 7 mm in air. Arbitrary concentrations of molecular oxygen ranging from 0% to that for air, preferably no more than about 1% and, even more preferable, no more than 0.1%, are employed for the cleansing atmosphere, depending upon the particular application involved. The latter value yields ranges of 10 cm and more for an intensity reduction of half the incident intensity, which will allow readily irradiating even sharply curved surfaces and/or the surfaces of small modular components with decontaminating radiation of sufficiently high intensities and thereby adequately cleaning them. It has been found that even heavily contaminated surfaces may be effectively cleaned using oxygen concentrations of about 0.1%. A stream of an ultrahigh-purity inert gas, such as nitrogen, to which the desired, low, concentration of oxygen has been admixed is employed as the stream of cleansing gas conducted over the full extent of the cleaning section.

The contaminants to be eliminated that might, for example, affect the performance of lithographic optics that operate in the VUV spectral region, are primarily hydrocarbons ($C_xH_y$) and water ($H_2O$). In the case of slight contamination by hydrocarbons, it has been found that there is frequently no need for adding any oxygen at all to the stream of inert cleansing gas, where its residual oxygen content may range from just a couple of ppm down to nearly oxygen-free atmospheres having $O_2$-concentrations of less than 0.1 ppm. The range of the 172-nm decontaminating radiation will then no longer be limited by absorption, and will be determined exclusively by the geometric arrangement of the UV-radiators 2.

In order to maintain a cleanly cleansing atmosphere, the walls of the cleaning chamber 1 are preferably fabricated from a material, such as degreased, electropolished, stainless steel, that is resistant to VUV-irradiation. Suitable flow rates for the stream of cleansing gas range from, e.g., 5 l(STP)/min (5 slm) to 50 l(STP)/min (50 slm). The cleansing-gas inlet 4 may be configured in the form of a gas shower head that will allow conducting the cleansing gas to the surfaces to be cleaned in a controlled manner.

The cleansing action at very low oxygen concentrations is attributable to an activation or breaking of the bonds of hydrocarbon molecules, some of which then desorb in the form of $C_xH_y$-molecules, and some of which are oxidized to $CO_2$ and $H_2O$ by ozone formed from any residual oxygen that may be present and then desorb, by the UV-radiation employed. It has been found that using this decontamination technology, which combines an array of UV-radiators 2 for irradiating large surface areas with a cleansing atmosphere having a low, or no, oxygen content allows effectively and economically decontaminating optical elements and modules configured from optical elements in adequate manners. Compared to cleaning using 157-nm laser radiation, the decontamination process employed here is much easier to use and allows cleaning much larger areas that are not limited to a few $mm^2$.

Figure 2:
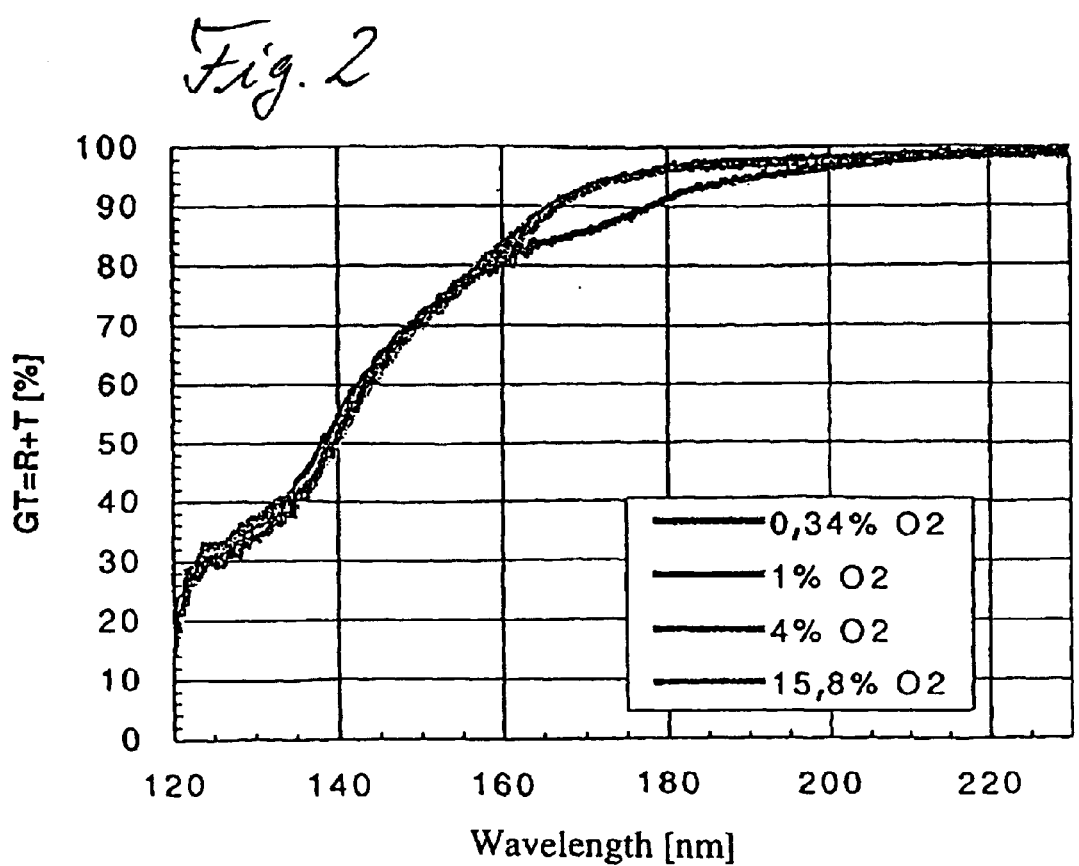

The plots of FIGS. 2 and 3 confirm the foregoing statements regarding the cleansing actions obtainable using the invention, in terms of concrete, graphic, depictions of cleaning results. In particular, FIG. 2 depicts the results of a series of trial runs, in which identical types of surfaces of optical elements coated with an antireflection coating were cleaned by 172-nm Xe-excimer radiation, as described above, employing cleansing atmospheres having differing oxygen partial pressures. The total transmittances, GT, i.e., the algebraic sum of the reflected portion, R, and transmitted portion, T, of the incident intensity, of the cleaned optical elements for collimated radiation as a function of wavelength were subsequently determined over the wavelength range extending from 120 nm to 230 nm, where cleansing atmospheres having four different oxygen concentrations ranging form 0.34% to 15.8% were employed. As may be seen from FIG. 2, similar, good, cleansing actions that yielded total transmittances, GT, of about 80% for 157-nm laser radiation and increased beyond that toward longer wavelengths, ultimately reaching nearly 100%, were obtained in all four cases.

FIG. 3 depicts a comparison of cleaning procedures according to the invention to the more problematical 157-nm laser-radiation cleaning that is applicable to small areas only. The series of trial runs, whose results are depicted in FIG. 3, were based on cleaning an optical element coated with an antireflection coating using both a cleaning process in accordance with the invention employing 172-nm Xe-excimer radiation and a cleaning process employing 157-nm laser radiation having an energy density of 2 $mJ/cm_2$. FIG. 3 illustrates their respective cleansing actions, based on the transmittance of the optical element subsequent to conclusion of the cleaning process as a function of the length of the irradiation period employed in the cleaning process. As may be seen from FIG. 3, the cleaning process according to the invention, which employs the simpler to set up and use 172-nm Xe-excimer radiation, yields good cleansing actions that are comparable to those of the more difficult to set up and use 157-nm laser radiation, where it may also be seen that the decontamination process according to the invention yielded even better transmittances than the competing process for longer irradiation periods.

Although in the case of the sample embodiment shown in FIG. 1, the decontamination device serves to clean individual optical elements or modules contained in the cleaning chamber 1 prior to their employment for beam-guidance purposes on an associated optical system, alternative embodiments of the invention allow decontaminating beam-guiding optics in a manner according to the invention, even after they have been assembled and placed in service, in which case, the decontamination device forms an integral part of the device that contains the beam-guiding optics. For example, the decontamination device may be part of a microlithographic projection-exposure system, within which, as in the case of other decontamination devices, e.g., those corresponding to the state of the art that were described at the outset hereof and thus require no further portrayal and explanation here, one or more UV-decontamination-radiation sources have been emplaced at suitable locations and a cleansing-gas-flushing system has been implemented. In this case, the lenses and other optical elements of the projection-exposure system may, from time to time, be subjected to the surface-decontamination process employing, e.g., 172-nm Xe-excimer radiation, combined with a stream of cleansing gas having a low, or no, oxygen content, both during fabrication operations taking place preceding, during, and subsequent to a coating process and during and subsequent to assembly and alignment of the optics after the exposure system has been placed in service.

The above description of the preferred embodiments has been given by way of example. From the disclosure given, those skilled in the art will not only understand the present invention and its attendant advantages, but will also find apparent various changes and modifications to the structures and methods disclosed. It is sought, therefore, to cover all such changes and modifications as fall within the spirit and scope of the invention, as defined by the appended claims, and equivalents thereof.

What is claimed is:

1. A method for decontaminating surfaces of beam-guiding optics, comprising:

irradiating the surfaces to be cleaned with UV-radiation in a cleansing atmosphere, wherein the wavelength of the UV-radiation employed for cleaning falls within a spectral range where oxygen absorbs strongly and the cleansing atmosphere has an oxygen concentration less than that of air.

2. A method according to claim 1, wherein the surfaces are surfaces of optical elements of microlithographic projection-exposure systems.

3. A method according to claim 1, wherein the oxygen concentration in the cleansing atmosphere is less than 1%.

4. A method according to claim 3, wherein the oxygen concentration in the cleansing atmosphere is less 0.1%.

5. A method according to claim 1, wherein the UV-radiation employed for cleaning is excimer radiation from a Xe-discharge lamp whose wavelength range falls in a vicinity of 172 nm.

6. A method according to claim 1, wherein the UV-radiation employed for cleaning is radiation from a low-pressure Hg-lamp.

* * * * *